United States Patent
Kadokawa

(10) Patent No.: US 6,777,105 B2
(45) Date of Patent: Aug. 17, 2004

(54) PART

(75) Inventor: Kazuto Kadokawa, Tokorozawa (JP)

(73) Assignee: Pioneer Corporation, Tokyo-to (JP)

( * ) Notice: Subject to any disclaimer, the term of this patent is extended or adjusted under 35 U.S.C. 154(b) by 0 days.

(21) Appl. No.: 09/995,591

(22) Filed: Nov. 29, 2001

(65) Prior Publication Data
US 2002/0064674 A1 May 30, 2002

(30) Foreign Application Priority Data
Nov. 29, 2000 (JP) ......................................... 2000-363550

(51) Int. Cl.$^7$ .............................. B32B 1/04; H05K 7/12; H05K 7/20
(52) U.S. Cl. ....................... 428/595; 428/596; 428/603; 428/620; 228/180.1
(58) Field of Search ................................. 428/595, 596, 428/603, 620; 228/180.1

(56) References Cited

U.S. PATENT DOCUMENTS

| 4,617,585 A | * | 10/1986 | Yasui ............................ 257/796 |
| 4,767,344 A | * | 8/1988 | Noschese ....................... 439/83 |
| 4,939,498 A | * | 7/1990 | Yamada et al. ............. 338/22 R |
| 5,029,748 A | * | 7/1991 | Lauterbach et al. ...... 228/180.1 |
| 5,288,959 A | * | 2/1994 | Henschen .................... 219/616 |
| 5,305,179 A |   | 4/1994 | Sono et al. |
| 6,273,327 B1 | * | 8/2001 | Murray et al. .............. 228/245 |
| 6,493,928 B1 | * | 12/2002 | Shinbo et al. ................. 29/741 |

FOREIGN PATENT DOCUMENTS

| JP | 60160642 | 8/1985 |
| JP | 01078000 | 3/1989 |
| JP | 04030498 | 2/1992 |

* cited by examiner

Primary Examiner—Deborah Jones
Assistant Examiner—Jason L Savage
(74) Attorney, Agent, or Firm—Young & Thompson

(57) ABSTRACT

A part has a body unit; and one or more leg formed on the body unit. One or more slit is formed on the body unit adjacent to the leg. The legs are inserted to insert holes of a printed wiring board or the like and soldered thereto. Since the slit is formed adjacent to the leg, the heat applied to the leg for the soldering is not radiated by the body unit by virtue of the slit. Therefore, the part can be reliably attached to the printed wiring board or the like.

2 Claims, 3 Drawing Sheets

PART

BACKGROUND OF THE INVENTION

1. Field of the Invention

This invention relates to a part to be attached and/or fixed to a printed wiring board by soldering.

2. Description of Related Art

There is known a soldering method in which electronic parts or small mechanisms are attached to a printed wiring board and then the copper foil surface of the printed wiring board is dipped in melting solder in a tank of a solder dipping device, thereby completing electrical connection of the electronic parts and/or attachment of the mechanisms to the copper foil portion by a single operation. The electronic parts to be attached to the printed wiring board generally have terminals of small heat capacity, and hence the terminals and the copper foil patterns can be easily soldered by dipping the printed wiring board in melting solder in a soldering device.

On the other hand, a heat radiating plate used for heat radiation of a three-terminal regulator and the like is small in size and is positioned adjacent to an electric circuit, and hence such a heat radiating plate is frequently used in a manner attached to the printed wiring board. In order to prevent that the small heat regulating plate damages the copper foil pattern to which a three-terminal regulator is attached when the external force is applied to the heat radiating plate, the legs of the heat radiating plate are soldered to the copper lands of the printed wiring board.

Since such a heat radiating plate has large heat capacity, the legs thereof cannot be soldered to the printed wiring board with sufficient reliability by simply dipping the legs in the melting solder in the soldering device. In addition, if a soldering iron is to be used, a special design in consideration of the soldering reliability is needed. In this view, various proposals have already been made.

For example, Japanese Laid-Open Utility Model application No. 5-95092 discloses the attachment manner of a heat radiating plate that offers improved soldering reliability when the soldering iron is used. This heat radiating plate is shown in FIG. 4. As shown, the heat radiating plate 2 has engaging portions 2a which are inserted into the attachment holes 1a of the printed wiring board 1, and small holes 2b are formed on the heat radiating plate 2 near the engaging portions 2a. With the heat radiating plate 2 thus configured, when the engaging portions 2a are heated by the soldering iron, the small holes 2b prevent the heat applied to the engaging portions 2a from radiating via the heat radiating plate, and thus the soldering operation can be easily performed.

The manner of attaching the heat radiating plate 2 described above improves the reliability of soldering in the case of soldering using the soldering iron However, in case of using the solder dipping device using nolead solder of high melting point, the heat applied to the engaging portion 2a propagates to the heat radiating plate 2 from the bottom areas leftward and rightward of the small hole 2b. As a result, the temperature of the nolead solder decreases, and hence soldering bridge takes place at the engaging portion 2a or the solder deforms to be ball-like shape, thereby deteriorating the reliability of soldering,

SUMMARY OF THE INVENTION

It is an object of the present invention to provide a part that can be reliably soldered to a printed wiring board even by a solder dipping device which uses nolead solder having high melting point.

According to one aspect of the present invention, there is provided a part including: a body unit, and one or more leg formed on the body unit, wherein one or more slit is formed on the body unit adjacent to the leg.

In accordance with the part thus configured, the legs are inserted to insert holes of a printed wiring board or the like and soldered thereto. Since the slit is formed adjacent to the leg, the heat applied to the leg for the soldering is not radiated by the body unit by virtue of the slit. Therefore, the part can be reliably attached to the printed wiring board or the like.

In an embodiment, the slit may be formed on the body unit such that a longitudinal direction of the slit coincides a longitudinal direction of the leg, and a length of the slit prescribes a length of the leg. The slit may be formed such as to position a tip of the leg remotely from the body unit, and thus the slit decreases radiation of heat applied to the leg by the body unit.

Preferably, the body unit may include a main plate and a pair of side plate connected to the main plate, and the main plate and the side plate may be formed in a U-shape in section. By this, the part can be stably attached to the printed wiring board even if any external force is applied.

Further, the body unit may include one or more attachment hole to which electronic part is attached. By this attachment hole, necessary electronic parts can be attached to the part.

The nature, utility, and further features of this invention will be more clearly apparent from the following detailed description with respect to preferred embodiment of the invention when read in conjunction with the accompanying drawings briefly described below.

DETAILED DESCRIPTION OF THE PREFERRED EMBODIMENTS

Figure 1:
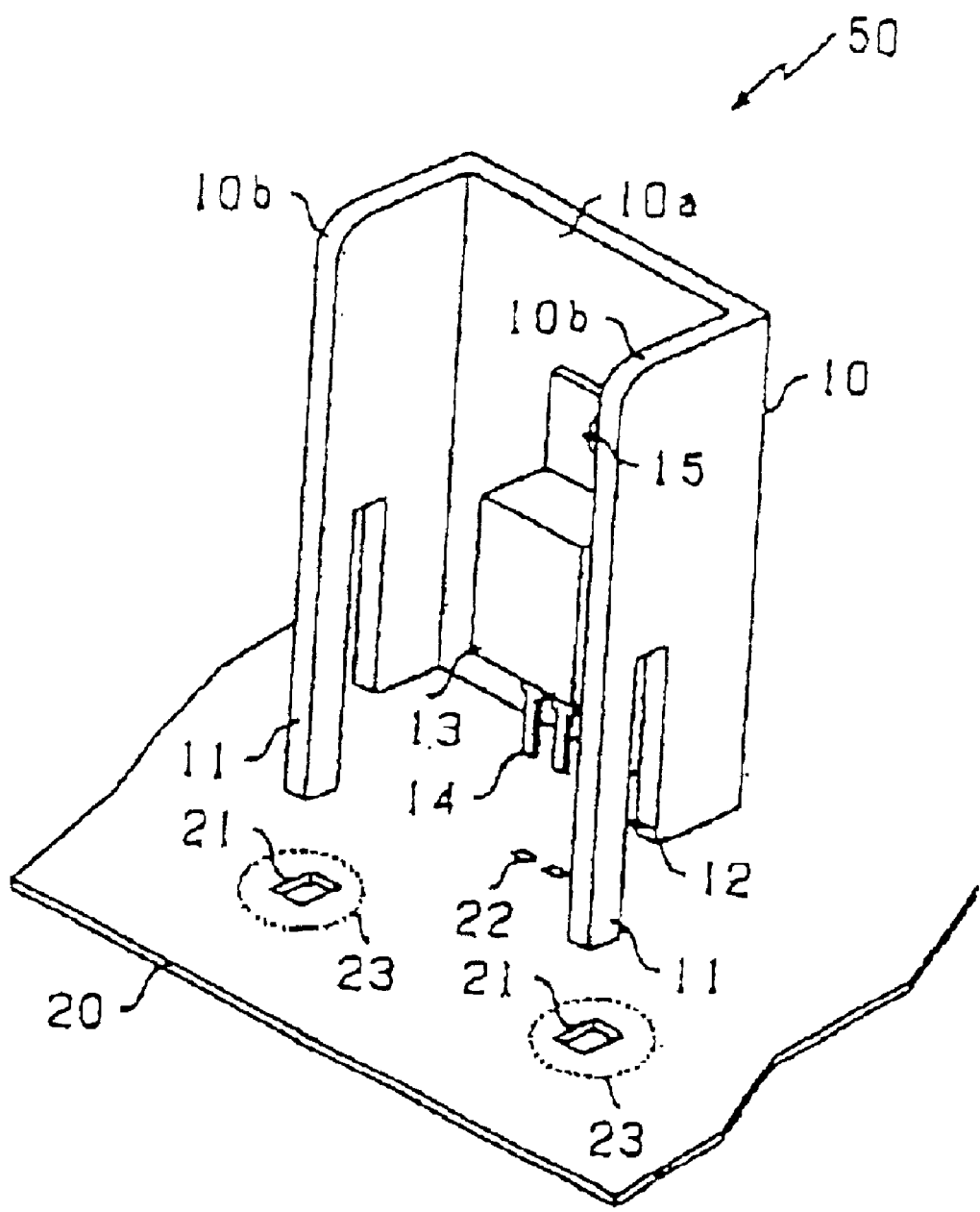
FIG. 1 is a perspective view of a heat radiating plate and a printed wiring board to which the heat radiating plate is attached.
Figure 2:
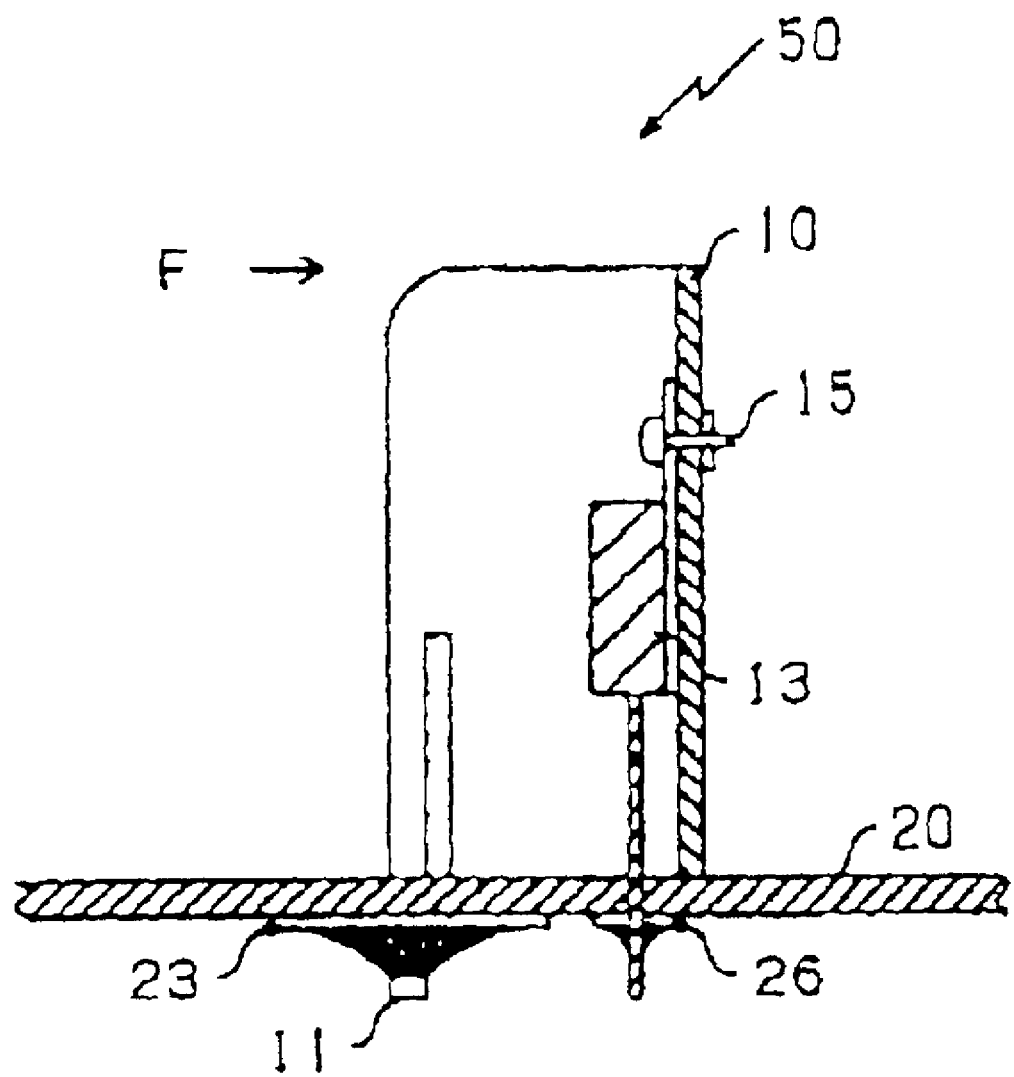
FIG. 2 is a sectional view of the heat radiating plate attached to the printed wiring board.

A configuration of a part according to an embodiment of the present invention will be described below. In the following embodiment, the present invention is applied to a small-size heat radiating plate for a three-terminal regulator as shown in FIGS. 1 and 2. FIG. 1 is a perspective view of the heat radiating plate 50 and a printed wiring board 20 to which the heat radiating plate 50 is attached. FIG. 2 is a sectional view of the heat radiating plate 50 in a state attached to the printed wiring board 20.

As shown in FIG. 1, the heat radiating plate 50 according to the embodiment is configured by a body unit 10 and legs 11. The body unit 10 is made of metal, and has a flat main plate 10a and a pair of side plates 10b formed by bending the metal into a U-shape in section. The legs 11 extend toward the longitudinal direction of the body unit 10 from the front bottom edges of the respective side plates 10b. The body unit 10 is formed with slits 12. By forming the slits 12 adjacent to the legs 11, the legs 11 extend for a certain length. In other words, by virtue of the slits 12, the legs 11 become longer. In addition, the heat radiating plate 50 has attachment hole (not shown) at the center of the main plate 10a, and the three-terminal regulator 13 is fixed to the heat radiating plate 50 by a screw 15 that passes through the attachment hole.

On the other hand, the printed wiring board 20 to which the heat radiating plate 50 is attached has insert holes 21 and 22. The insert holes 21 receive the legs 11 of the heat radiating plate 50, respectively, and the insert holes 22 receive the terminals 14 of the three-terminal regulator 13. Further, the printed wiring board 20 has copper foil lands 23 and a copper foil pattern 26. The copper foil lands 23 are formed on the lower surface (i.e., the surface opposite to the heat radiating plate 50) of the printed wiring board 20, and the legs 11 passing through the insert holes 21 are soldered to the copper foil lands 23. The terminals 14 of the three-terminal regulator 13 passing through the insert holes 22 are soldered to the copper foil pattern 26.

Next, the method of soldering the heat radiating plate 50 to the printed wiring board 20 will be described. First, the legs 11 of the heat radiating plate 50 are inserted into the insert holes 21, and, at the same time, the terminals 14 of the three-terminal regulator 13 fixed to the body unit 10 are inserted into the insert holes 22 of the printed wiring board 20. Thus, the heat radiating plate 50 is provisionally attached to the printed wiring board 20.

Then, the surface of the printed wiring board 20 which is formed with the copper foil lands 23 and the copper foil pattern 26 is dipped in the melting nolead solder in the solder tank of the soldering device (not shown) for a predetermined time period. By this, the terminals 14 of the three-terminal regulator 13 are soldered to the copper foil pattern 26, and the legs 11 of the heat radiating plate 50 are soldered to the copper foil lands 23.

When the legs 11 of the heat radiating plate 50 are heated by being dipped into the nolead solder tank, the heat radiating plate 50 radiates the heat from the body unit 10 (i.e., the main plate 10a and the side plates 10b). However, according to the heat radiating plate 50 of the present invention, since the slits 12 are formed adjacent to the legs 11, the heat radiation effect by the legs 11 are quite small, and the temperature decrease of the nolead solder around the legs 11 can be suppressed to a minimum degree. Therefore, as shown in FIG. 2, the heat radiating plate 50 is securely soldered to the copper foil lands 23.

As described above, according to the heat radiating plate 50 of this embodiment, reliable soldering may be performed by simply handling the printed wiring board 20 with the parts attached thereto by the soldering device, Therefore, the reformation of the solder by using the soldering iron may be avoided, and mass-productivity and operation efficiency may be improved.

Further, since the heat radiating plate 50 according to the embodiment has the legs 11 formed at the front edge portions of the side plates 10b formed in the U-shape in section, if the external force F is applied to the body unit 10 as shown in FIG. 2, the head radiating plate 50 hardly inclines. Therefore, it is possible to prevent any stress from being applied to the terminals 14 of the three-terminal regulator 13 and/or the copper foil pattern 26 soldered to the terminals 14.

Still further, since the heat radiating plate 50 of this embodiment has the slits 12 formed adjacent to the front edges of the side plates 10b, the inherent heat radiation property of the heat radiating plate 50 (for radiating the heat of the three-terminal regulator 13) is not deteriorated.

Figure 3:
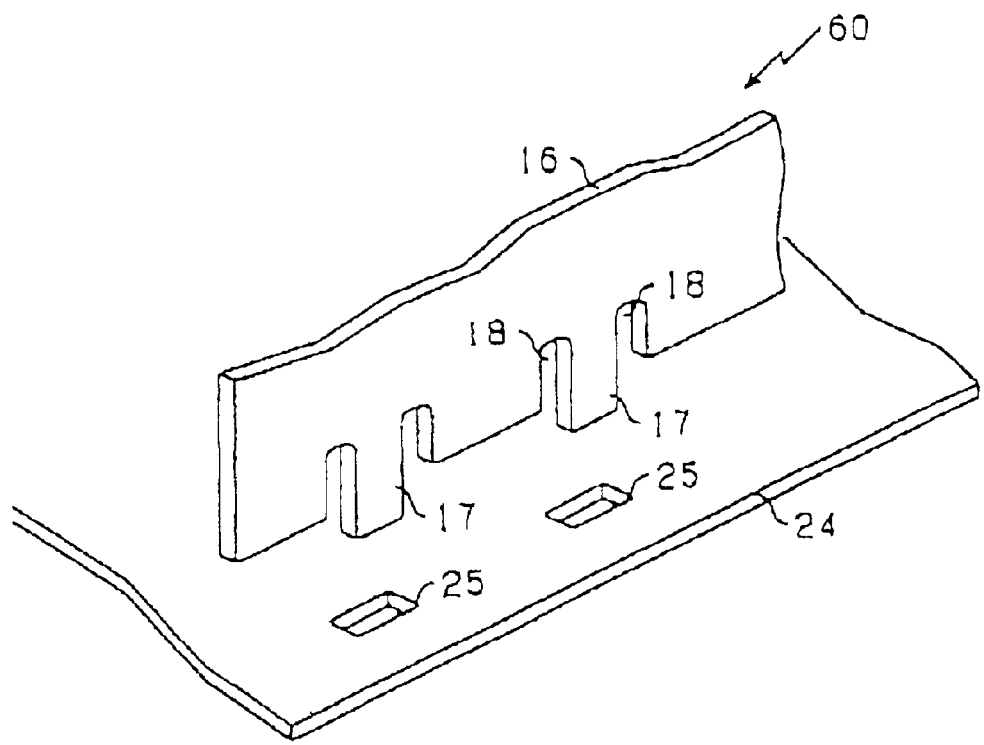
FIG. 3 is a perspective view of a part according to another embodiment of the present invention.
Figure 4:
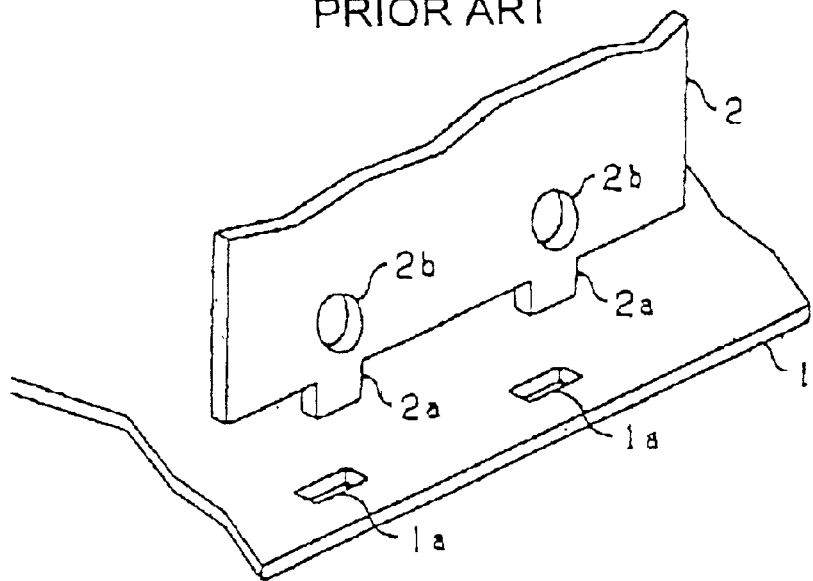
FIG. 4 is a diagram showing a configuration of a conventional heat radiating plate.

Next, a part according to another embodiment of the present invention will be described. The part according to this embodiment is a metal bus bar 60 for strengthening the pattern. FIG. 3 is a perspective view showing a bus bar 60 and a portion of a printed wiring board 24 to which the bus bar 60 is attached.

The bus bar 60 is configured by a body unit 16 and legs 17 formed by metal, and the slits 18 are formed on the body unit 16 adjacent to the legs 17. On the other hand, the insert holes 25 are formed on the printed wiring board 24 at the positions corresponding to the legs 17. On the lower surface of the printed wiring board 24, copper foil lands (not shown) to which the legs 17 are soldered are formed around the insert holes 25.

When the printed wiring board 24 to which the bus bar 60 thus configured is attached is dipped into the nolead solder tank, the slits 18 suppress the temperature decrease of the (nolead solder around the legs 17. Therefore, the legs 11 are securely soldered to the copper foil lands of the printed wiring board 24.

As described above, the part according to the embodiments of the present invention are formed with the slits on the body unit at the position adjacent to the legs. Since the legs can be long by virtue of the slits, the tips of the legs that are heated in soldering process can be separated from or located relatively far from the body unit of the heat radiating plate. Therefore, the temperature decrease at the-tips of the legs can be suppressed, and reliable soldering may be ensured.

It is appreciated that the application of the present invention is not limited to the above-described heat radiating plate and bus bar, and the present invention is applicable to various types of parts, such as holders for fixing parts, to be soldered to a printed wiring board.

As described above, the present invention provides parts suitable for mass production and securely soldered to a print wiring board by a solder dipping device that uses nolead solder having high melting point.

The invention may be embodied on other specific forms without departing from the spirit or essential characteristics thereof. The present embodiments therefore to be considered in all respects as illustrative and not restrictive, the scope of the invention being indicated by the appended claims rather than by the foregoing description and all changes which come within the meaning an range of equivalency of the claims are therefore intended to embraced therein.

The entire disclosure of Japanese Patent Application No 2000-363350 filed on Nov. 29, 2000 including the specification, claims, drawings and summary is incorporated herein by reference in its entirety.

What is claimed is:

1. A part comprising:
    a body unit comprising a main plate and a pair of side plates connected to the main plate, the main plate and the side plates being formed such that the body unit has a U-shape in section; and
    legs formed on the body unit, the legs being formed at an end of each side plate on a remote side from the main plate, wherein one or more slit is formed on the side plate adjacent to the leg, a portion of the side plate other than the leg having a length substantially equal to a length of the main plate in a longitudinal direction of the leg.

2. A part according to claim 1, wherein the slit is formed on the side plate so as to have a predetermined length in a direction of the leg.

* * * * *